United States Patent
Lim

(10) Patent No.: US 8,916,941 B2
(45) Date of Patent: Dec. 23, 2014

(54) SEMICONDUCTOR DEVICE HAVING SILICIDE ON GATE SIDEWALLS IN ISOLATION REGIONS

(71) Applicant: Samsung Electronics Co., Ltd., Suwon-si (KR)

(72) Inventor: Hoon Lim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/013,853

(22) Filed: Aug. 29, 2013

(65) Prior Publication Data
US 2013/0341732 A1 Dec. 26, 2013

Related U.S. Application Data

(63) Continuation of application No. 12/660,943, filed on Mar. 8, 2010, now abandoned.

(30) Foreign Application Priority Data

Mar. 9, 2009 (KR) .................. 10-2009-0019943

(51) Int. Cl.
| | | |
|---|---|---|
| H01L 29/78 | (2006.01) | |
| H01L 27/088 | (2006.01) | |
| H01L 21/28 | (2006.01) | |
| H01L 29/423 | (2006.01) | |
| H01L 29/66 | (2006.01) | |

(52) U.S. Cl.
CPC ........ *H01L 27/088* (2013.01); *H01L 21/28052* (2013.01); *H01L 29/4238* (2013.01); *H01L 29/665* (2013.01); *H01L 29/6659* (2013.01); *H01L 29/7833* (2013.01)
USPC .................. 257/413; 257/E29.156

(58) Field of Classification Search
None
See application file for complete search history.

(56) References Cited

U.S. PATENT DOCUMENTS 7,084,458 B1 * 8/2006 Khan et al. .................. 257/336
7,633,126 B2 12/2009 Matsui
(Continued)

FOREIGN PATENT DOCUMENTS

| JP | 2007-27348 | 2/2007 |
|---|---|---|
| JP | 2007-67371 | 3/2007 |

(Continued)

OTHER PUBLICATIONS

"Semiconductor Device Having Silicide on Gate Sidewalls in Isolation Regions" Specification, Drawings, and Prosecution History, of U.S. Appl. No. 12/660,943, filed Mar. 8, 2010, by Hoon Lim, which is stored in the United States Patent and Trademark Office (USPTO) Image File Wrapper (IFW) system.

*Primary Examiner* — Daniel Luke
(74) *Attorney, Agent, or Firm* — Onello & Mello, LLP

(57) ABSTRACT

Provided are a semiconductor device and a method of fabricating the same. According to the semiconductor device, a silicide layer is formed on at least a part of both sidewalls of a gate pattern on a device isolation layer, thereby reducing resistance of the gate pattern. This makes an operation speed of the device rapid. According to the method of the semiconductor device, a sidewall spacer pattern is formed on at least a part of both sidewalls of the gate pattern in following salicide process by entirely or partially removing remaining portions of the sidewall spacer except for portions which are used as an ion implantation mask to form source/drain regions. This can reduce resistance of the gate pattern, thereby fabricating a semiconductor device with a rapid operation speed.

11 Claims, 20 Drawing Sheets

(56) References Cited

U.S. PATENT DOCUMENTS

| | | |
|---|---|---|
| 2004/0173855 A1* | 9/2004 | Masuoka et al. ............... 257/371 |
| 2005/0106799 A1* | 5/2005 | Doris et al. .................... 438/199 |
| 2005/0124104 A1* | 6/2005 | Jung ............................... 438/197 |
| 2005/0272256 A1 | 12/2005 | Wang |
| 2007/0023832 A1 | 2/2007 | Matsui |
| 2007/0173004 A1* | 7/2007 | Hall et al. ..................... 438/197 |
| 2007/0197009 A1* | 8/2007 | Srivastava et al. ............ 438/583 |
| 2008/0026522 A1* | 1/2008 | Doris et al. ................... 438/218 |
| 2008/0029836 A1* | 2/2008 | Zhu ................................ 257/412 |
| 2008/0203493 A1 | 8/2008 | Yasuda |
| 2008/0311718 A1 | 12/2008 | Futase |
| 2010/0224942 A1 | 9/2010 | Lim |

FOREIGN PATENT DOCUMENTS

| | | |
|---|---|---|
| JP | 2008-205385 | 9/2008 |
| KR | 10-2008-0078590 | 8/2008 |

* cited by examiner

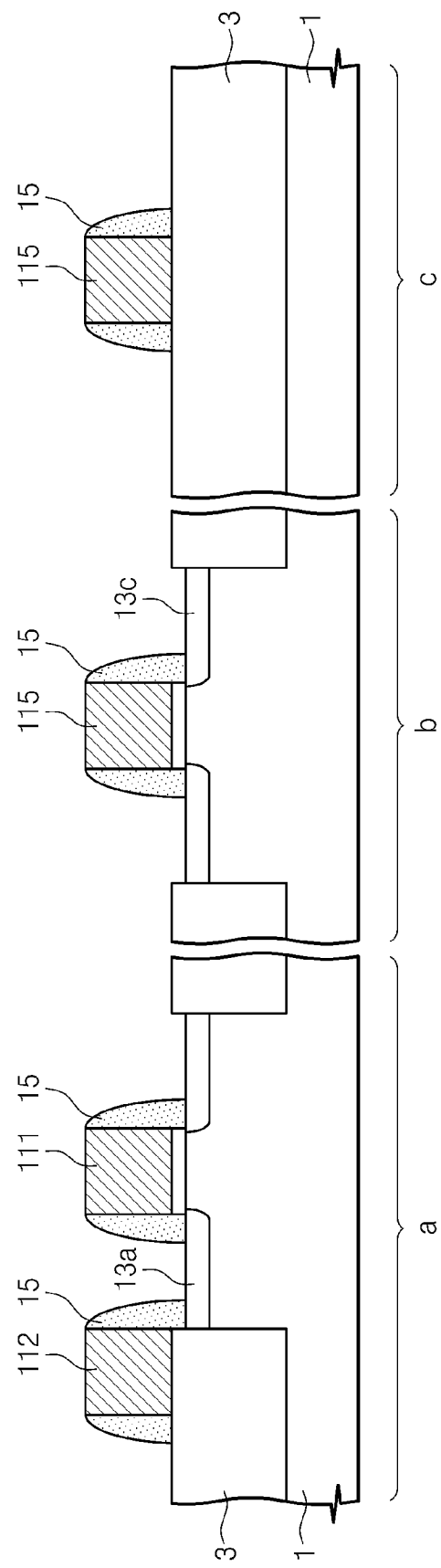

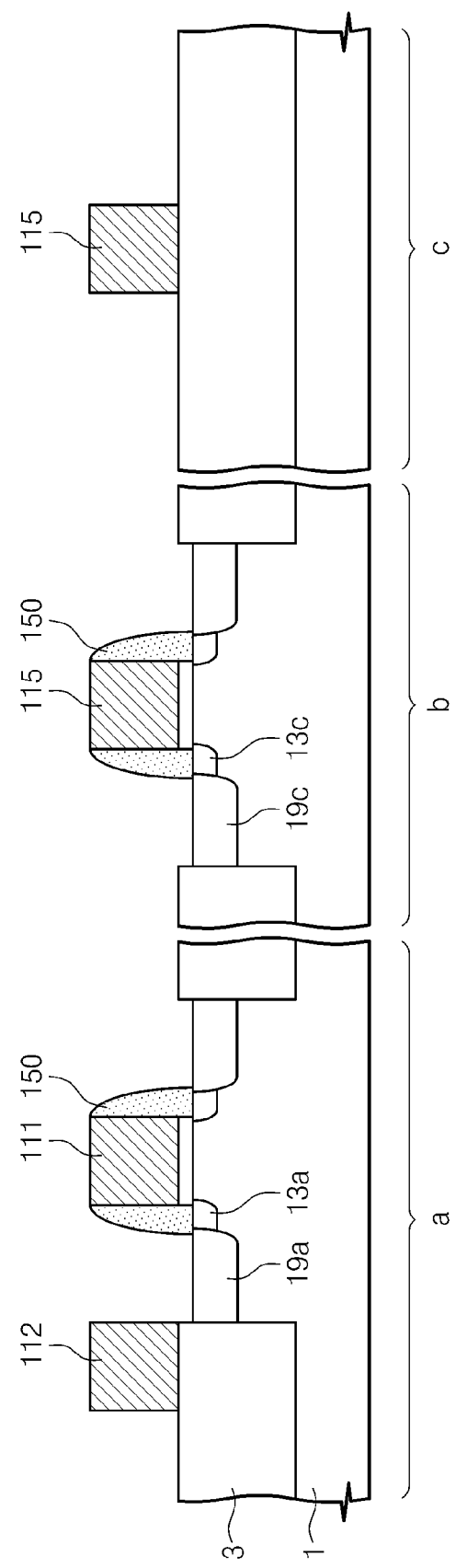

SEMICONDUCTOR DEVICE HAVING SILICIDE ON GATE SIDEWALLS IN ISOLATION REGIONS

CROSS-REFERENCE TO RELATED APPLICATIONS

This application is a continuation application of U.S. non-provisional patent application Ser. No. 12/660,943, filed Mar. 8, 2010, which claims priority under 35 U.S.C. §119 of Korean Patent Application 10-2009-0019943, filed in the Korean Intellectual Property Office on Mar. 9, 2009, the entire contents of which are hereby incorporated by reference.

BACKGROUND

The inventive concept relates to a semiconductor device and a method of fabricating the same.

Generally, a gate sidewall spacer is used as an ion implantation mask in a transistor to form source/drain regions. Furthermore, the gate sidewall spacer plays important roles in insulating a silicide layer and a gate layer, which will be formed by a subsequent salicide process, from each other such that they are not connected to each other. Due to the silicide layer and the gate layer, however, there are problems that the integration degree of semiconductor devices deteriorates and the contact area becomes smaller, resulting in increasing the contact resistance.

SUMMARY

The present inventive concept provides a semiconductor device and a method of fabricating the same that can increase an operation speed of devices.

The present inventive concept also provides a semiconductor device and a method of fabricating the same that can prevent current from leaking into a semiconductor substrate.

Embodiments of the inventive concept provide a semiconductor device including: a device isolation layer located on a semiconductor substrate to define an active region; a gate pattern crossing over the active region and the device isolation layer; a sidewall spacer pattern covering a sidewall of the gate pattern on the active pattern; and a gate silicide layer covering at least a part of both sidewalls of the gate pattern on the device isolation layer.

In some embodiments, the sidewall spacer pattern may expose all of both sidewalls of the gate pattern on the device isolation layer, and the gate silicide layer may cover both of the exposed sidewalls of the gate pattern.

In some embodiments, the sidewall spacer pattern may cover a lower portion of both sidewalls of the gate pattern on the device isolation layer, and a width of the sidewall spacer pattern located on the device isolation layer may be smaller than half of that of the sidewall spacer pattern located on the active region.

In some embodiments, the semiconductor device may further include: a conductive line located on the device isolation layer adjacent to the active region, the conductive line being adjacent to the gate pattern; a conductive line silicide layer covering at least both sidewalls of the conductive line; an active silicide layer formed on the active region and coming in contact with a sidewall of the device isolation layer; and a shared contact coming in contact with the active silicide layer and the conductive line silicide layer at the same time.

In some embodiments, the gate pattern and the conductive line may include a polysilicon layer doped with impurities or undoped with impurities.

Embodiments of the inventive concept also provide a method of fabricating a semiconductor device, the method including: forming a device isolation layer defining an active region on a semiconductor substrate; forming a gate pattern crossing over the active region and the device isolation layer; forming a sidewall spacer covering entirely a sidewall of the gate pattern; and forming a sidewall spacer pattern by removing remaining portions of the sidewall spacer except for portions which are used as an ion implantation mask to form source/drain regions.

In some embodiments, the removing of a portion of the sidewall spacer includes leaving a remaining portion of the sidewall spacer used as an ion implantation mask to form source/drain regions.

In some embodiments, the removing of a portion of the sidewall spacer includes: forming a mask layer covering the sidewall spacer located on the sidewall of the gate pattern on the active region but exposing the sidewall spacer on the device isolation layer; and removing at least a part of the sidewall spacer exposed by the mask layer.

In some embodiments, the forming of the sidewall spacer pattern may include: forming a mask layer covering the sidewall spacer located on the sidewall of the gate pattern on the active region but exposing the sidewall spacer on the device isolation layer; and removing at least a part of the sidewall spacer exposed by the mask layer.

In some embodiments, the method may further include: forming a conductive line adjacent to the gate pattern, the conductive line crossing over the device isolation layer; and forming a conductive line spacer covering entirely a sidewall of the conductive layer. In this configuration, at least a part of the conductive line spacer on the device isolation layer may be removed in the removing of at least a part of the sidewall spacer.

In some embodiments, the part of the conductive line spacer may be formed to come in contact with an active region located between the gate pattern and the conductive line. In this configuration, the method may further include: forming an impurity implantation region in the active region by using an ion implantation process; forming a conductive silicide layer covering at least a part of both sidewalls of the conductive line and an active silicide layer on the active region; and forming a shared contact coming in contact with the active silicide layer and the conductive line silicide layer at the same time.

In some embodiments, the conductive line and the gate pattern may include a polysilicon layer doped with impurities or undoped with impurities.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to describe principles of the inventive concept.

FIGS. 3B, 4B, 5B, 6B, 7B, and 8B are sectional views taken along the lines I-I, II-II, and III-III of FIGS. 3A, 4A, 5A, 6A, 7A, and 8A, respectively.

FIG. 7C is a sectional view taken along the lines I-I, II-II, and III-III of FIG. 7A.

DETAILED DESCRIPTION OF PREFERRED EMBODIMENTS

Figure 1A:
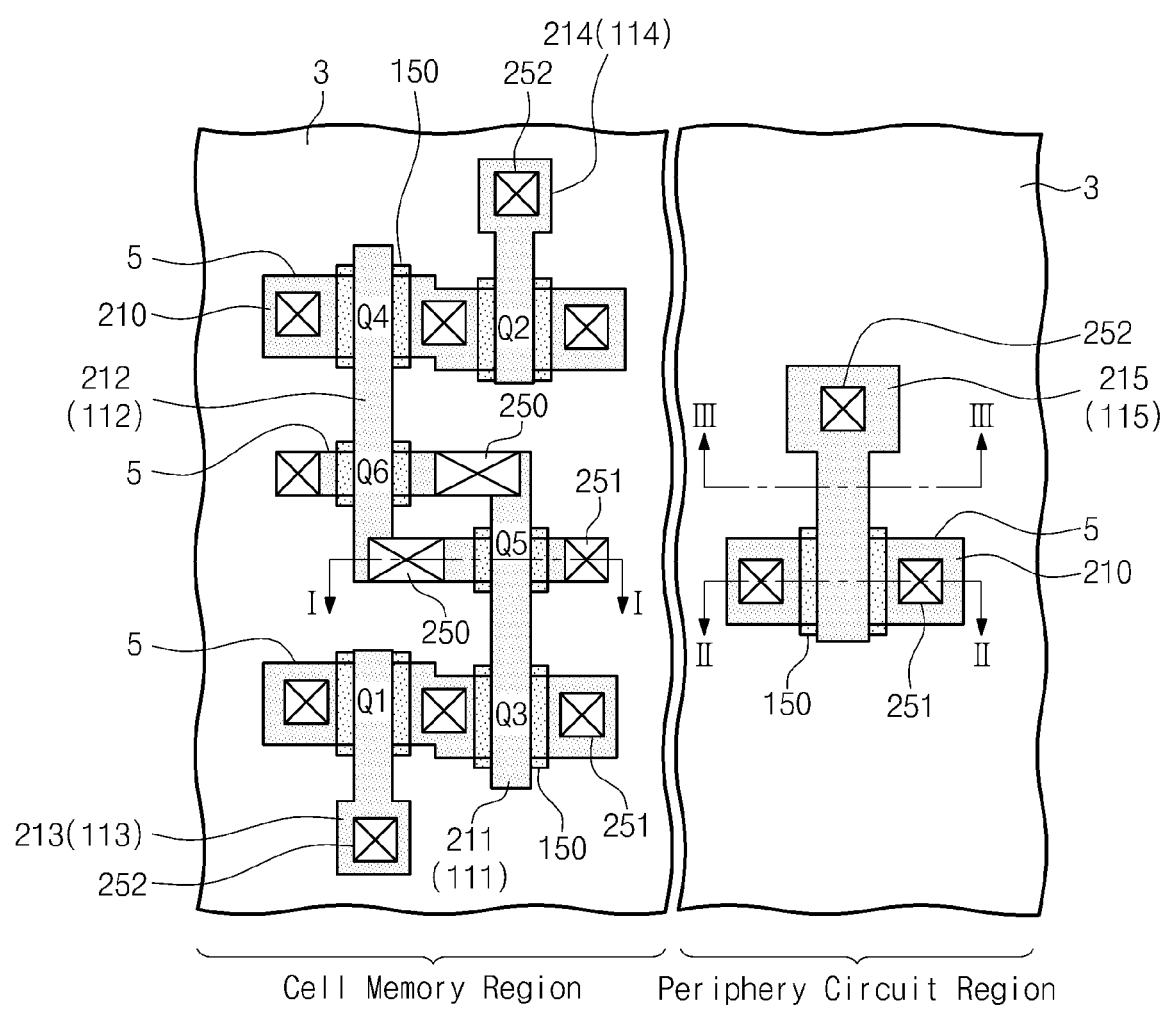
FIG. 1A is a plan view illustrating a semiconductor device according to an embodiment of the inventive concept.

Preferred embodiments of the inventive concept will be described below in more detail with reference to the accompanying drawings. Advantages and features of the inventive concept may be understood more readily by reference to the following detailed description of preferred embodiments and the accompanying drawings. The exemplary embodiments of the inventive concept may, however, be embodied in many different forms and should not be construed as being limited to the embodiments set forth herein. Rather, these embodiments are provided so that this description will be thorough and complete and will fully convey the scope of the inventive concept to those skilled in the art, and the embodiments of the inventive concept will only be defined by the appended claims. Like reference numerals refer to like elements throughout the specification.

It will be understood that when any layers such as a conductive layer, a semiconductor layer, or an insulating layer are referred to as being "on" another material layer or substrate, it may be directly on the other material layer or substrate, or intervening elements or layers may be present. Moreover, it will be understood that, although the terms first, second, etc. are used herein to describe various elements, these elements should not be limited by these terms. These terms are used to distinguish one element from another. Accordingly, a first layer used in one embodiment of the inventive concept may be used to as a second layer in another embodiment of the inventive concept.

Figure 1B:
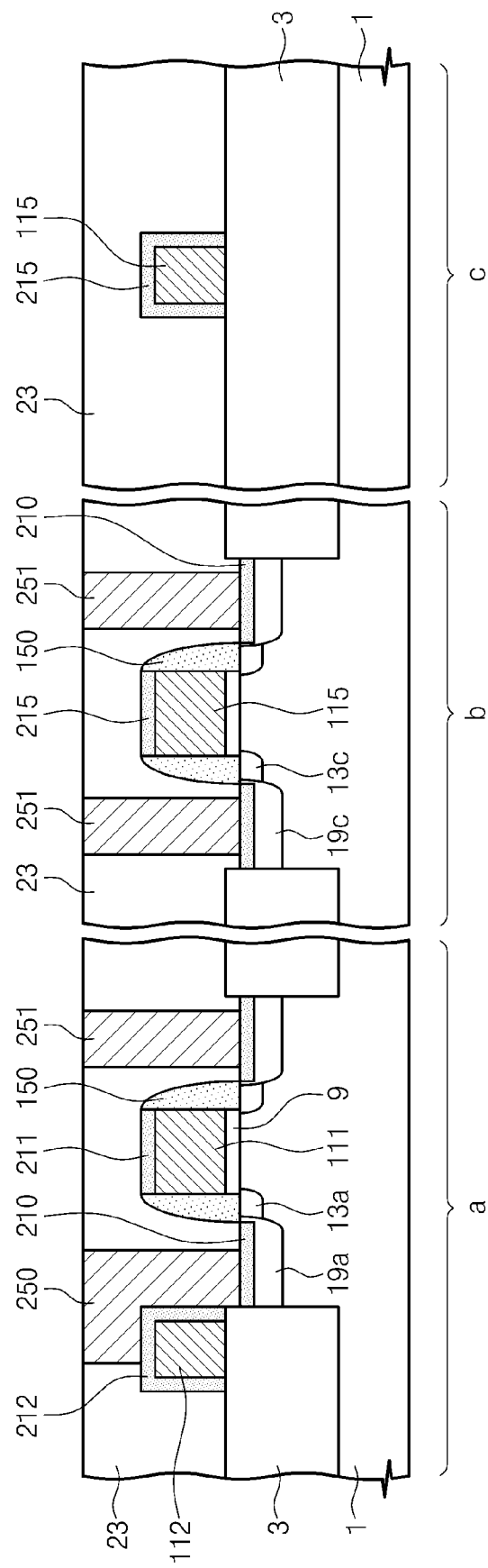
FIG. 1B is a sectional view taken along the lines I-I, II-II, and III-III of FIG. 1A.

FIG. 1A is a plan view illustrating a semiconductor device according to an embodiment of the inventive concept. FIG. 1B is a sectional view taken along the lines I-I, II-II, and III-III of FIG. 1A. In FIG. 1B, a region "a" shows a sectional view taken along the line I-I of FIG. 1A, a region "b" shows a sectional view taken along the line II-II of FIG. 1A, and a region "c" shows a sectional view taken along the III-III of FIG. 1A.

With reference to FIGS. 1A and 1B, a device isolation layer 3 defining active regions 5 is disposed on a semiconductor substrate 1 including a cell memory region and a periphery circuit region. One exemplary transistor is illustrated in the periphery circuit region. An exemplary unit memory cell of a full CMOS-type SRAM is illustrated in the cell memory region. On the semiconductor substrate 1 of the cell memory region, specifically, four parallel bar-shaped active regions 5 are formed in one direction, and long bar-shaped cell gate patterns 111 to 114 cross over the active regions 5 in a direction perpendicular to the one direction. In the cell memory region, the cell gate patterns 111 to 114 include a first cell gate pattern 111, a second cell gate pattern 112, a third cell gate pattern 113, and a fourth cell gate pattern 114. A gate insulating layer 9 is interposed between the semiconductor substrate 1 and each of the cell gate patterns 111 to 114. A low-concentration impurity implantation region 13a and a high-concentration impurity implantation region 19a are formed in the semiconductor substrate 1 of the active regions adjacent to the cell gate patterns 111 to 114. The impurity implantation regions 13a and 19a and the cell gate patterns 111 to 114 form six transistors Q1 to Q6. The transistors Q1 to Q6 include two access transistors Q1 and Q2, two drive transistors Q3 and Q4, and two load transistors Q5 and Q6, which form two flip-flop circuits, respectively.

The periphery circuit region is provided with a periphery circuit transistor which includes a periphery gate pattern 115, which crosses over the active region 5, and a low-concentration impurity implantation region 13c and a high-concentration impurity implantation region 19c formed in the semiconductor substrate 1 of the active region 5 adjacent to the periphery gate pattern 115. The gate patterns 111 to 115 may include a polysilicon layer that is doped with impurities or undoped with impurities.

In the semiconductor device of FIGS. 1A and 1B, sidewall spacer patterns 150 are formed on the sidewalls of the gate patterns 111 to 115 crossing over the active regions 5 or on the sidewalls of the gate patterns 111 to 115 overlapping with the active regions 5. That is, the sidewall spacer patterns 150 are formed on the sidewalls of the gate patterns 111 to 115 forming the transistors. In the gate patterns 111 to 115, the surfaces which are not covered with the sidewall spacer patterns 150 are all covered with gate silicide layers 211 to 215, respectively. Moreover, an active silicide layer 210 is formed on the semiconductor substrate 1 of the active region 5 which are not covered with the sidewall spacer pattern 150, which is illustrated in detail in FIGS. 2A and 2B.

Figure 2A:
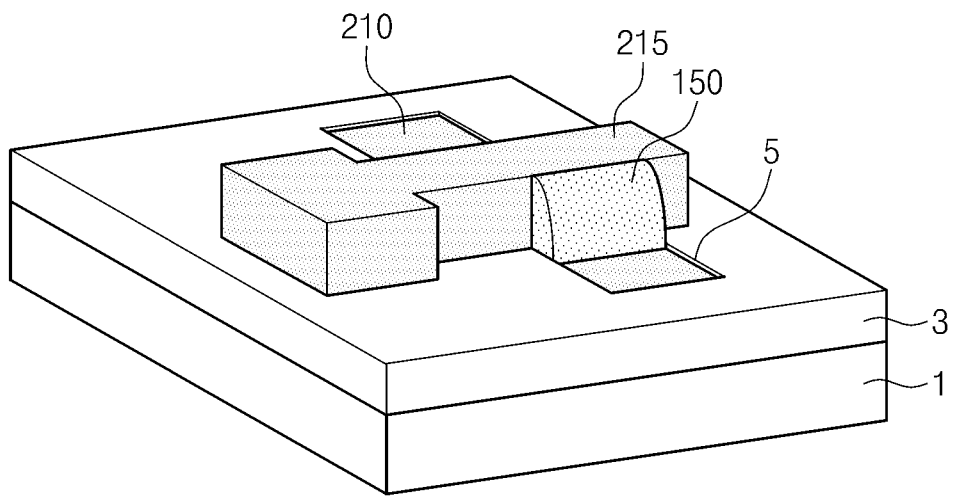
FIG. 2A is a perspective view illustrating a transistor in a periphery circuit region illustrated in FIG. 1A.
Figure 2B:
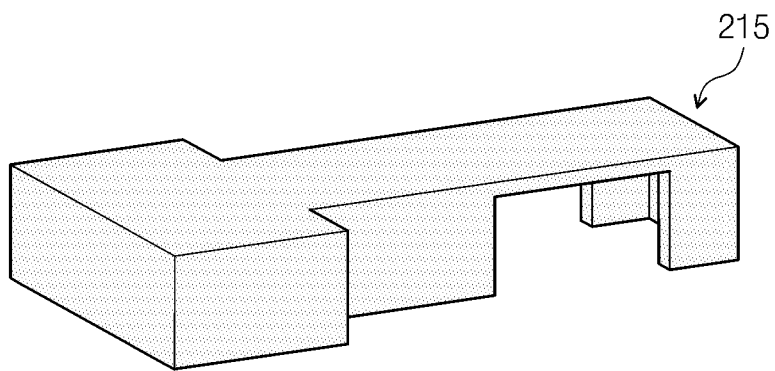
FIG. 2B is a perspective view illustrating a silicide layer illustrated in FIG. 2A.

FIG. 2A is a perspective view illustrating the transistor in the periphery circuit region of FIG. 1A. FIG. 2B is a perspective view illustrating the periphery gate silicide layer 215 illustrated in FIG. 2A. Referring to FIGS. 2A and 2B, the device isolation layer 3 is formed on the semiconductor substrate 1 of the periphery circuit region to define the active regions 5. The periphery gate pattern 115 crosses over the active region 5 and is located on the device isolation layer 3. In the active region 5, the sidewall spacer patterns 150 are formed on only the sidewalls of the periphery gate pattern 115, and the periphery gate silicide layer 215 covers all of the sidewalls and the upper surface of the circuit gate pattern 115 corresponding to the exposed remaining portions which are not covered with the sidewall spacer pattern 150. The shape of the periphery gate silicide layer 215 of FIG. 2B is similar to a lid covering the periphery gate pattern 115. Therefore, since the area where the periphery circuit gate pattern 115 is covered with the silicide layer 215 having a relatively low resistance is maximized, it is possible to reduce the resistance of a gate electrode.

Referring again to FIGS. 1A and 1B, with respect to the cell gate patterns 111 to 114 of the cell memory region, all of the remaining portions other than the sidewalls overlapping with the active regions 5 are also covered with the cell gate silicide layers 211 to 214, like the periphery gate pattern 115. The cell gate silicide layers 211 to 214 include a first cell gate silicide layer 211, a second cell gate silicide layer 212, a third cell gate silicide layer 213, and a fourth cell gate silicide 214. Contact plugs 251 and 252 are disposed on the active silicide layer 210 and the third and fourth cell gate silicide layers 213 and 214 to apply a voltage. The active silicide layer 210 and the first and second cell gate silicide layers 211 and 212 come in contact with a shared contact 250. The active silicide layer 210 is adjacent to the load transistors Q5 and Q6 among the transistors Q1 to Q6 and is located between the first cell gate pattern 111 and the second cell gate pattern 112. First and second cell gate silicide layers 211 and 212 cover the end portions of the first and second cell gate patterns 111 and 112 located on the device isolation layer 3 adjacent to the active silicide layer 210. The active silicide layer 210 disposed below the shared contact 250 comes in contact with the sidewall of the device isolation layer 3, it can prevent current from leaking to the semiconductor substrate 1. With reference to the sectional view of the region "a" of FIG. 1B, since an area of the active silicide layer 210 and the second cell gate silicide 212 coming in contact with the shared contact 250 is large, a contact resistance can be reduced.

Next, a process of fabricating the semiconductor device illustrated in FIGS. 1A and 1B will be described. FIGS. 3A, 4A, 5A, 6A, 7A, and 8A are plan views illustrating the process of fabricating the semiconductor device illustrated in FIG. 1A. FIGS. 3B, 4B, 5B, 6B, 7B, and 8B are sectional views taken along the lines I-I, II-II, and III-III of FIGS. 3A, 4A, 5A, 6A, 7A, and 8A, respectively. FIG. 7C is a sectional view taken along the lines I-I, II-II, and III-III of FIG. 7A.

Figure 3A:
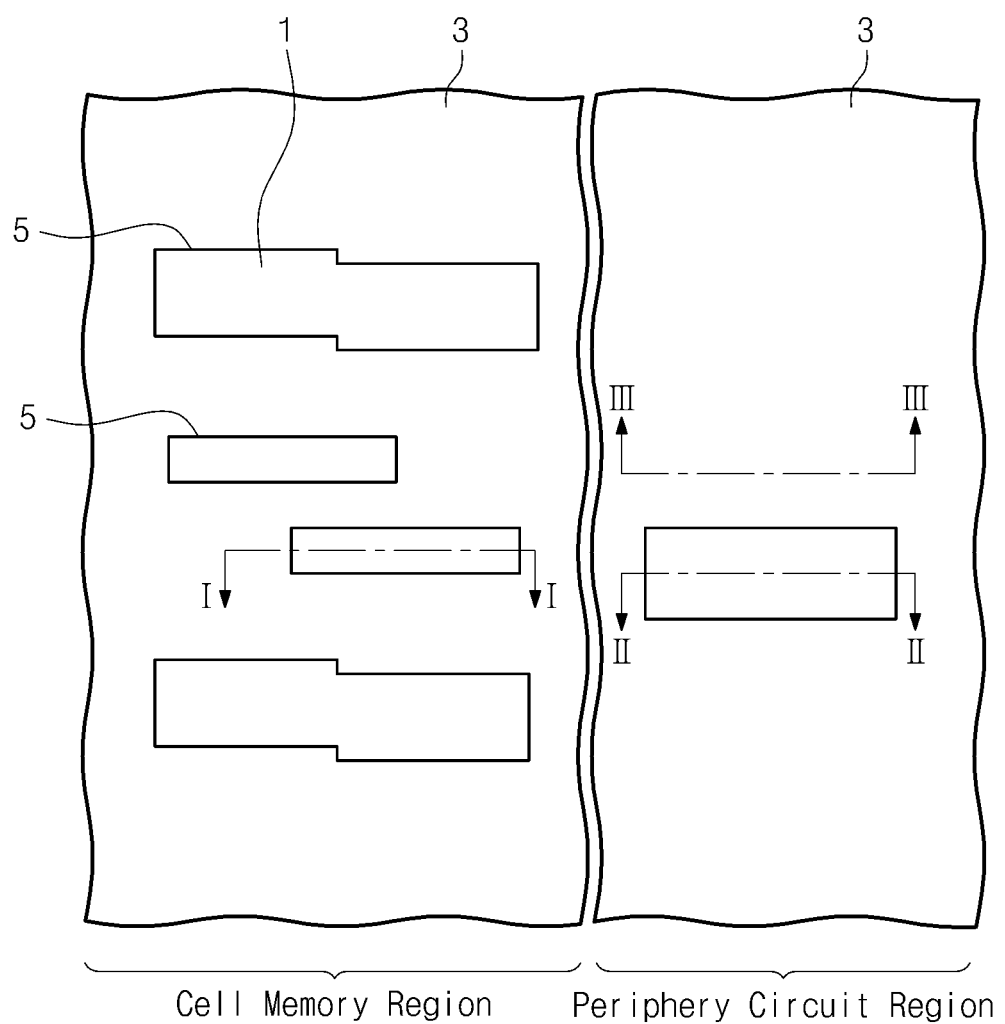
FIGS. 3A, 4A, 5A, 6A, 7A, and 8A are plan views illustrating a process of manufacturing the semiconductor device illustrated in FIG. 1A.
Figure 3B:
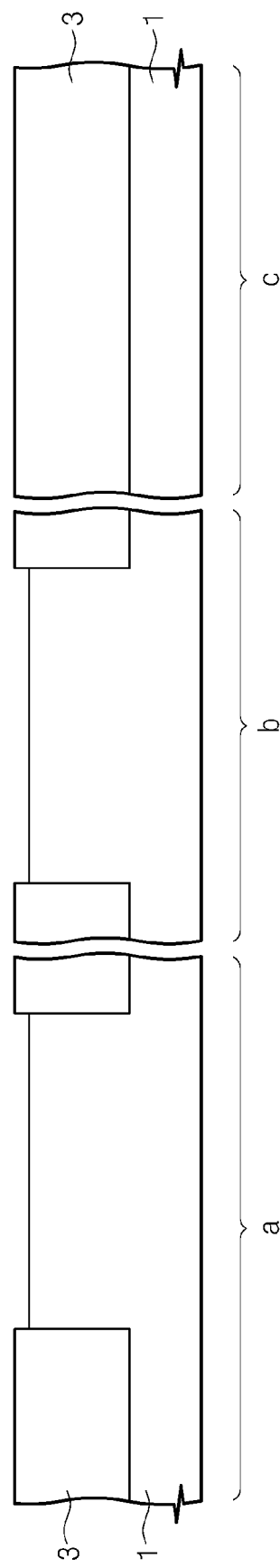

Referring to FIGS. 3A and 3B, the device isolation layer 3 is formed on the semiconductor substrate 1 to define the active regions 5. The device isolation layer 3 is formed by, for example, STI (Shallow Trench Isolation). Before and/or after the device isolation layer 3 is formed, the well region may be formed by implanting impurities into the semiconductor substrate 1.

Figure 4A:
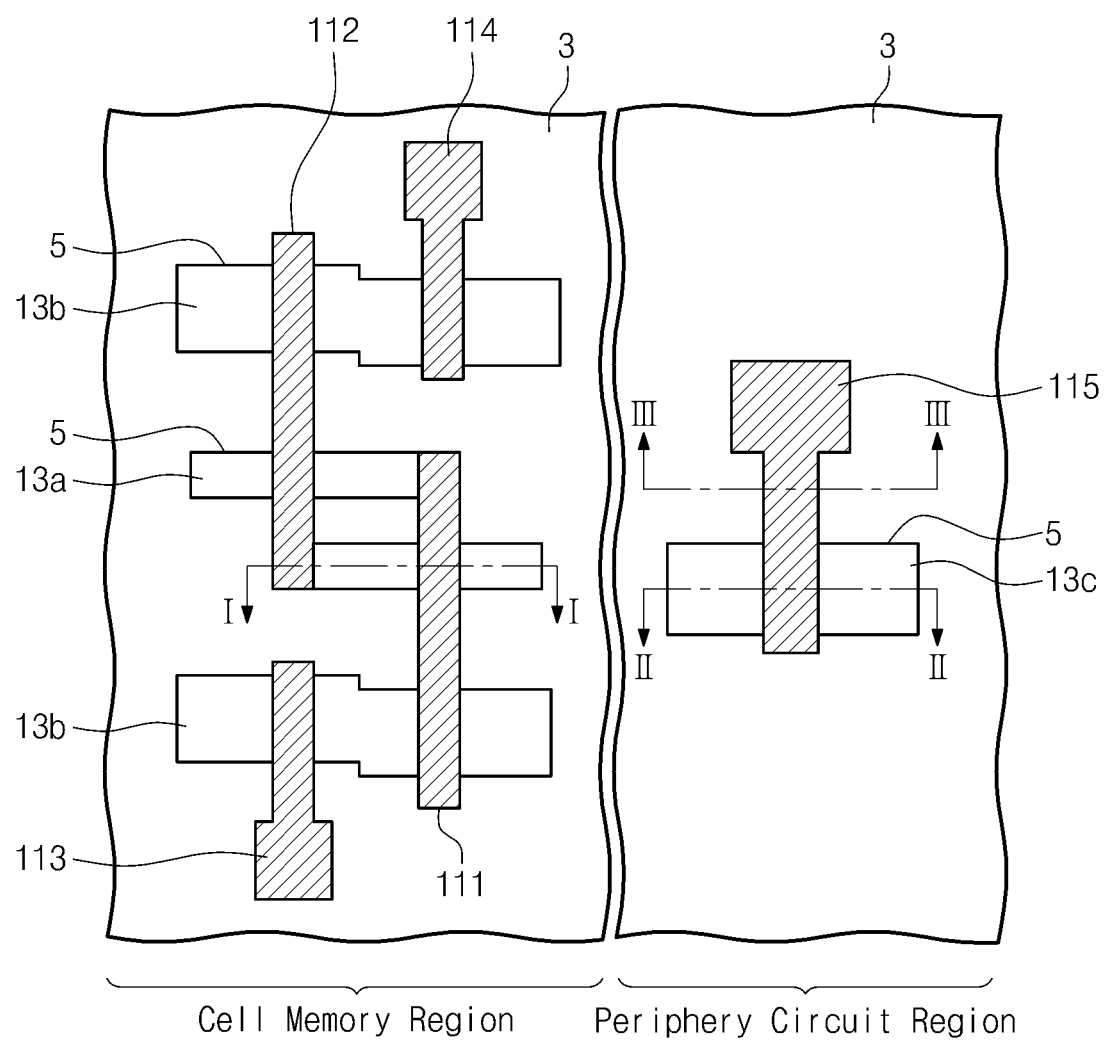
Figure 4B:
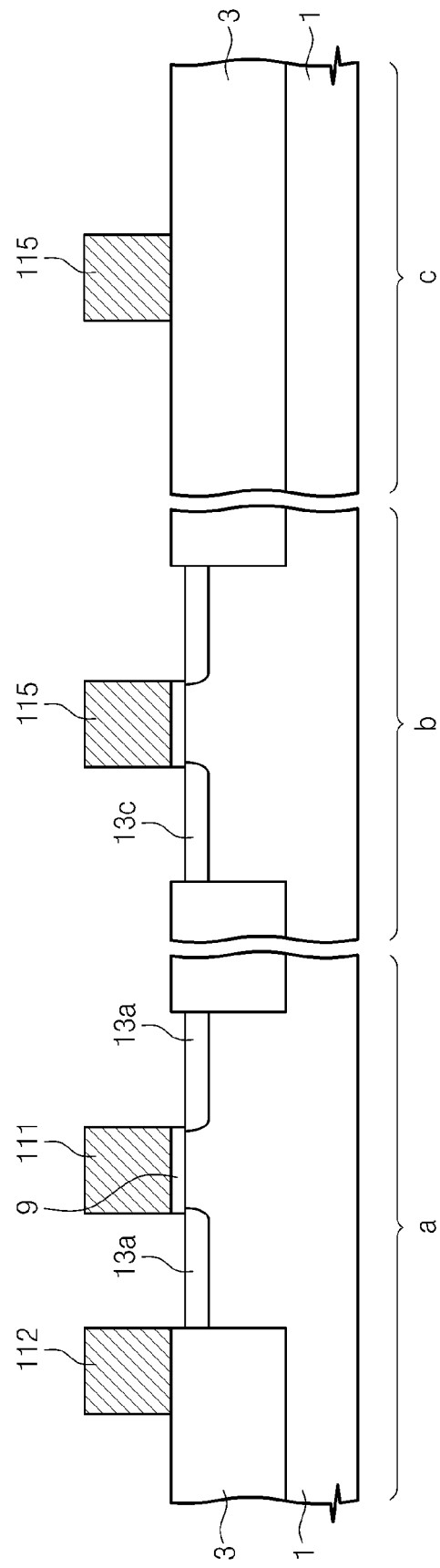

Referring to FIGS. 4A and 4B, the semiconductor substrate 1 of the active regions 5 is subjected to a thermal oxidation process to form the gate insulating layer 9. A gate layer is formed on the entire surface of the semiconductor substrate 1. The gate patterns 111 to 115 are formed by patterning the gate layer. Although not illustrated in drawings, a capping layer may further be formed on the gate layer. When the gate layer is patterned, the capping layer may be patterned together to form capping layer patterns on the gate patterns 111 to 115, respectively. The gate patterns 111 to 115 may include a polysilicon layer doped with impurities or undoped with impurities. Alternatively, the gate patterns 111 to 115 may be formed so as to include a metal containing layer. By using the gate patterns 111 to 115 as an ion implantation mask, low-concentration impurities are implanted into the semiconductor substrate 1 of the active regions 5 on both sides of the gate patterns 111 to 115 to form the low-concentration impurity implantation regions 13a, 13b, and 13c. The low-concentration impurity implantation regions 13a, 13b, and 13c may include a first low-concentration impurity implantation region 13a, a second low-concentration impurity implantation region 13b, and a third low-concentration impurity implantation region 13c. The first low-concentration impurity implantation region 13a may be doped with P-type impurities. The second low-concentration impurity implantation region 13b may be doped with N-type impurities.

Figure 5A:
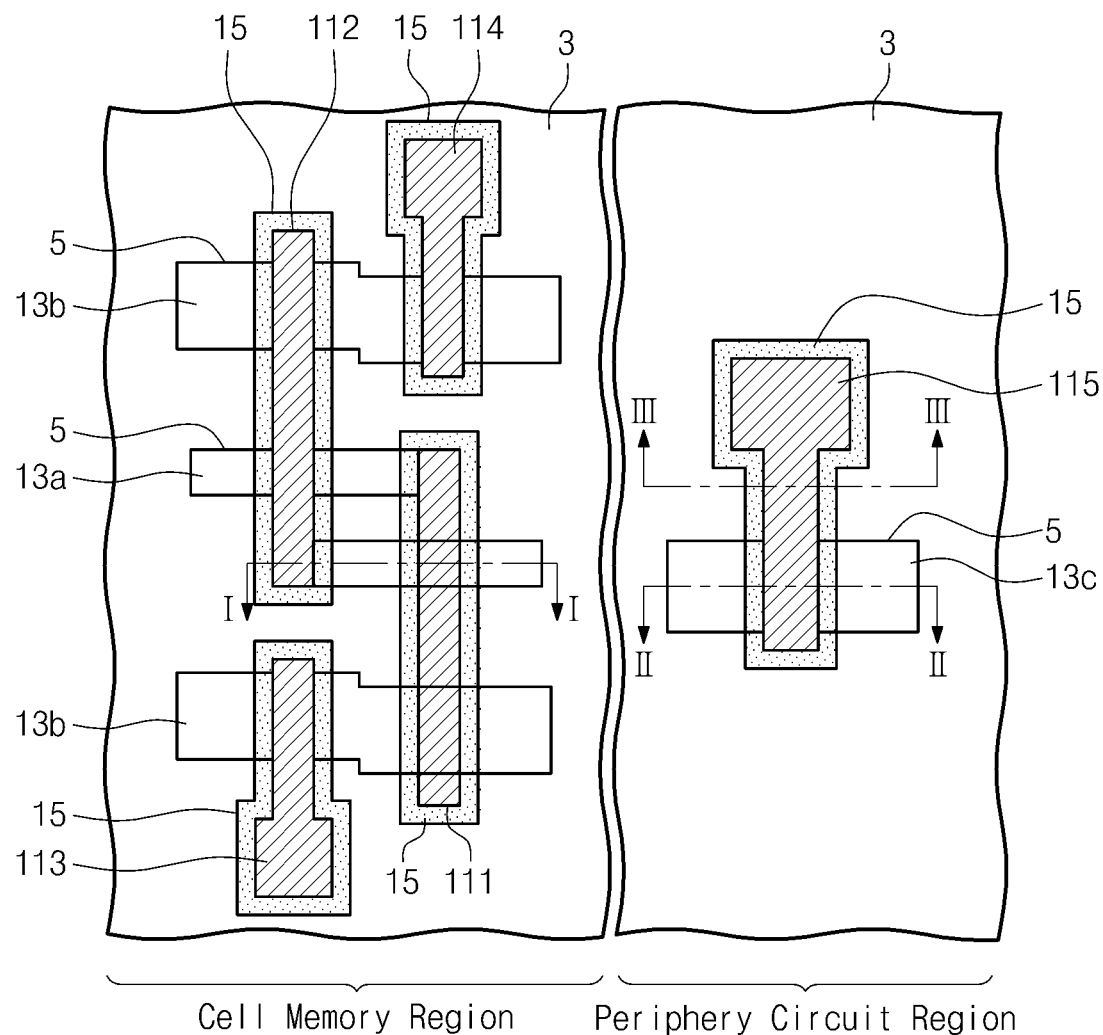

Referring to FIGS. 5A and 5B, a spacer layer is stacked on the entire surface of the semiconductor substrate 1. The spacer layer is anisotropically etched to form sidewall spacers 15 covering all of the sidewalls of the gate patterns 111 to 115. The spacer layer may be at least one selected from a group including a silicon oxide layer, a silicon nitride layer, and a silicon oxynitride layer. Since the sidewall spacer 15 covers all of the sidewalls of the gate patterns 111 to 115, the sidewall spacer 15 is formed not only on the active regions 5 but also on the device isolation layer 3.

Figure 6A:
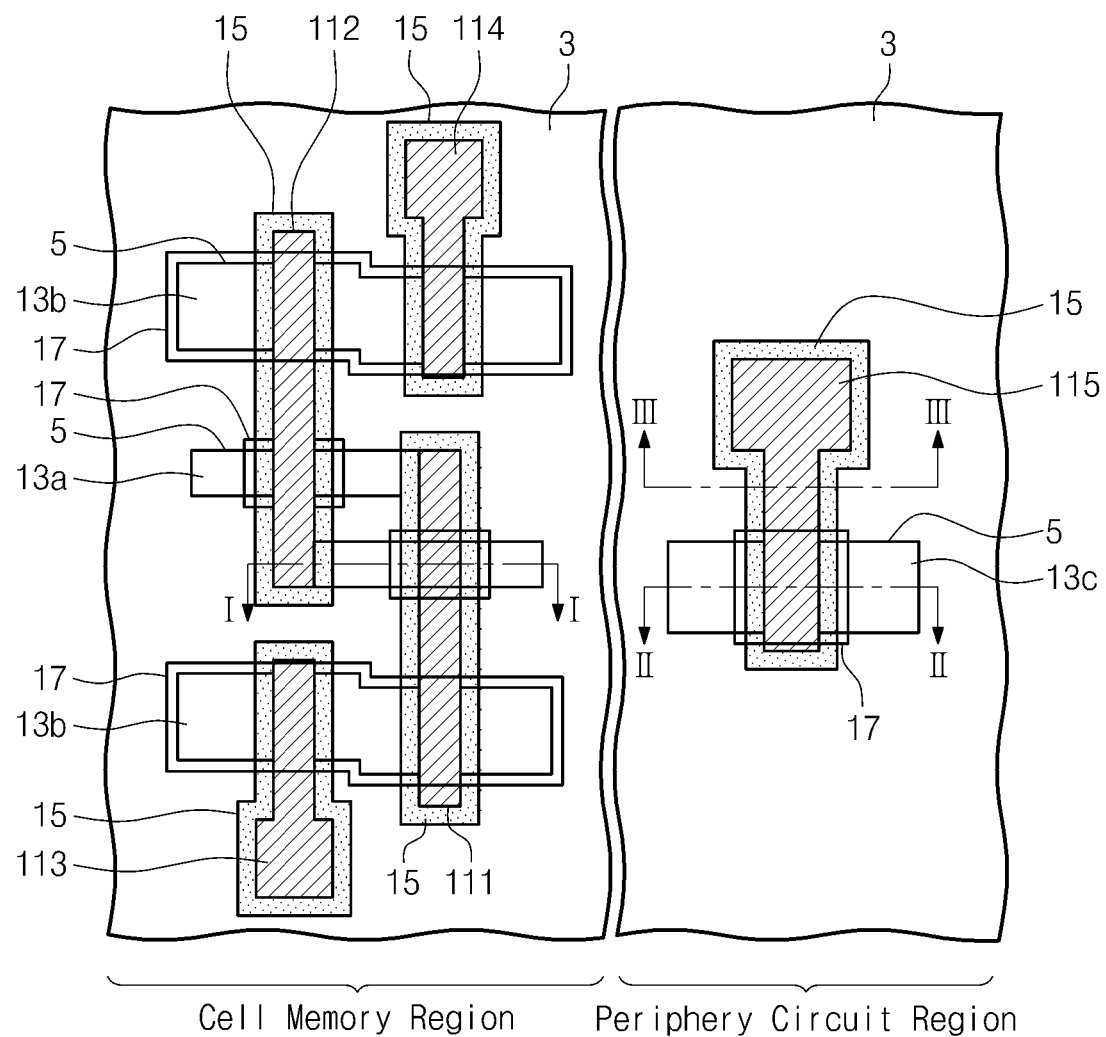
Figure 6B:
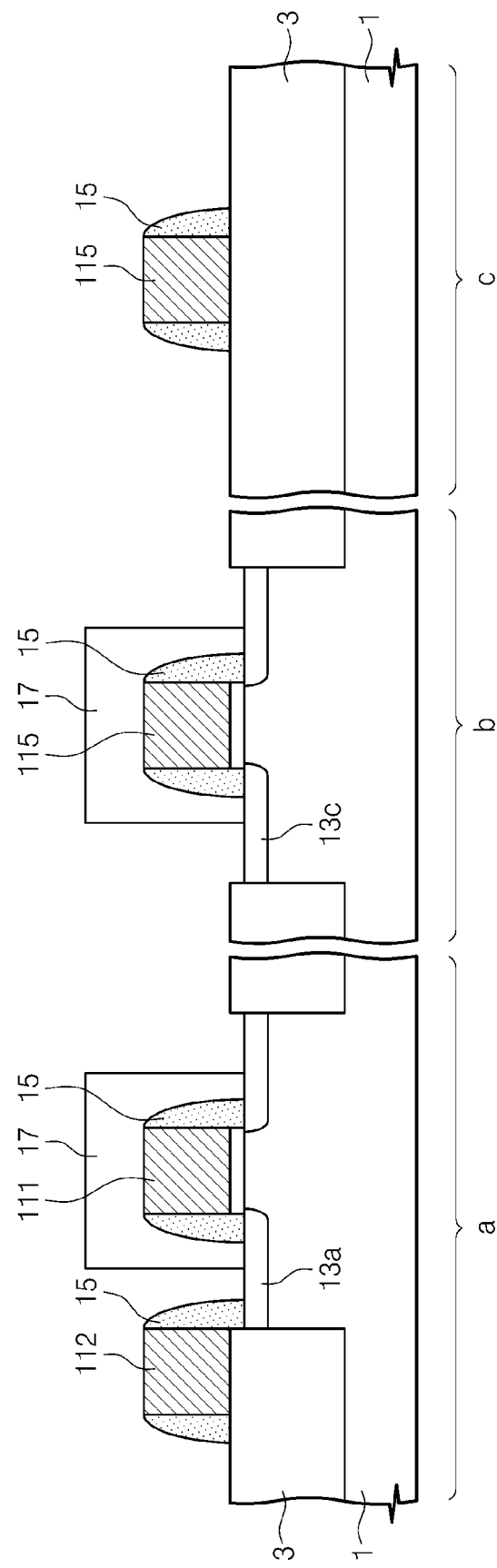
Figure 7A:
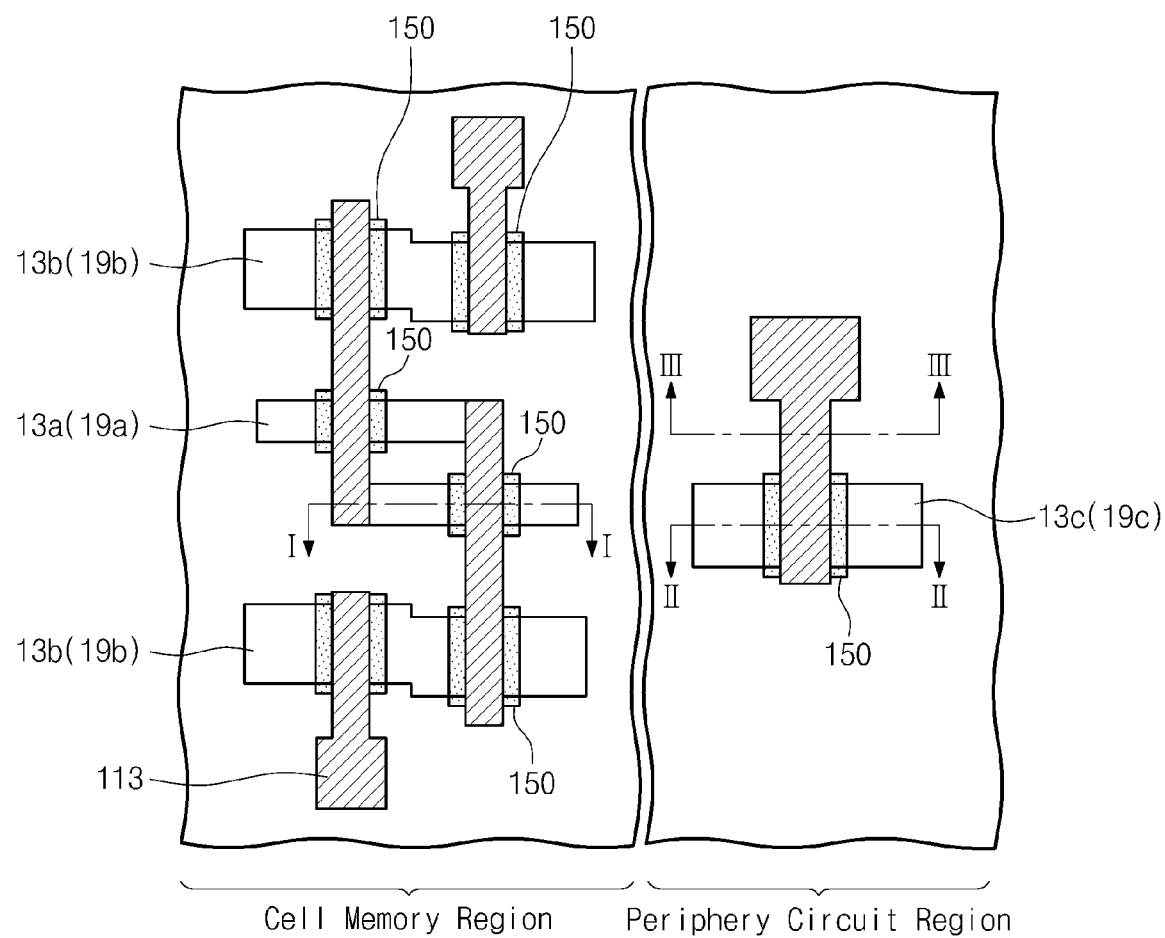

Referring to FIGS. 6A and 6B, a mask 17 is formed to expose the remaining portions of the sidewall spacer 15 except for portions which are used as the ion implantation mask to form source/drain regions. The mask 17 is formed so as to cover the sidewall spacer 15 located on the sidewalls of the gate patterns 111 to 115 overlapping with the active patterns 5. The mask 17 may be, for example, a photoresist pattern.

Figure 7B:
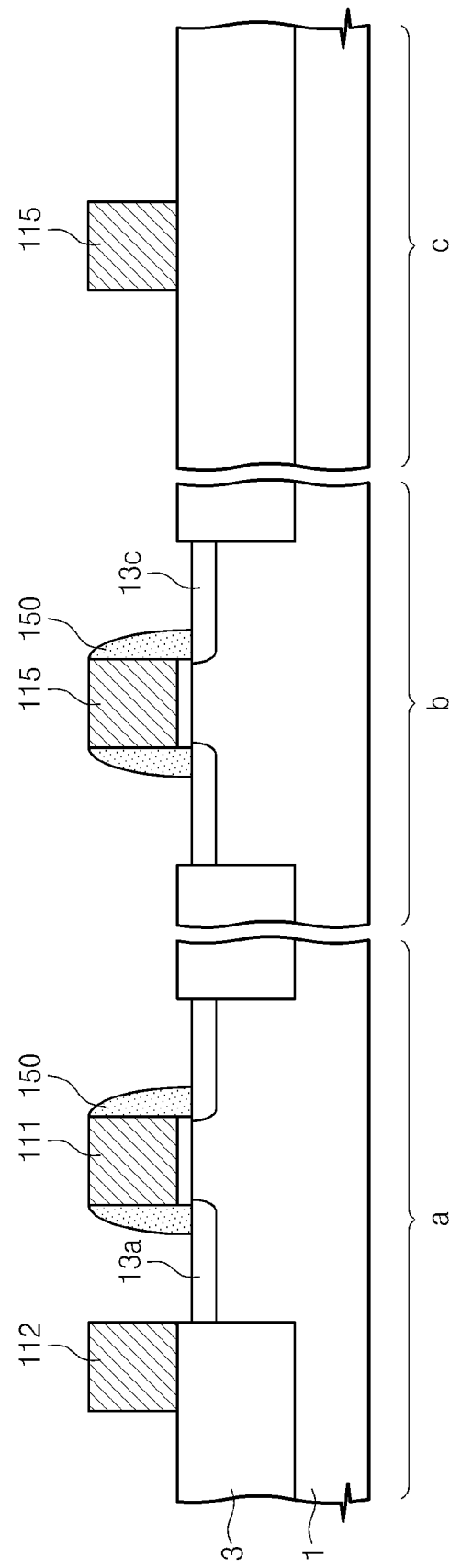

Referring to FIGS. 7A and 7B, the exposed sidewall spacer 15 which is not covered with the mask 17 is removed using the mask 17 as an etching mask. At this time, for example, an anisotropic dry etching process may be executed. In this way, the sidewall spacer pattern 150 is formed, which covers the sidewalls of the gate patterns 111 to 115 overlapping with the active patterns 5.

Referring to FIGS. 7A and 7C, the high-concentration impurity implantation regions 19a, 19b, and 19c are formed by implanting high-concentration impurities into the sidewall spacer pattern 150 using as an ion implantation mask. The high-concentration impurity implantation regions 19a, 19b, and 19c include a first high-concentration impurity implantation region 19a, a second high-concentration impurity implantation region 19b, and a third high-concentration impurity implantation region 19c. The first high-concentration impurity implantation region 19a may be doped with P-type impurities. The second high-concentration impurity implantation region 19b may be doped with N-type impurities. Referring to the sectional view of a region "c" of FIG. 7C, the first high-concentration impurity implantation region 19a is formed so as to come in contact with the device isolation layer 3.

Figure 8A:
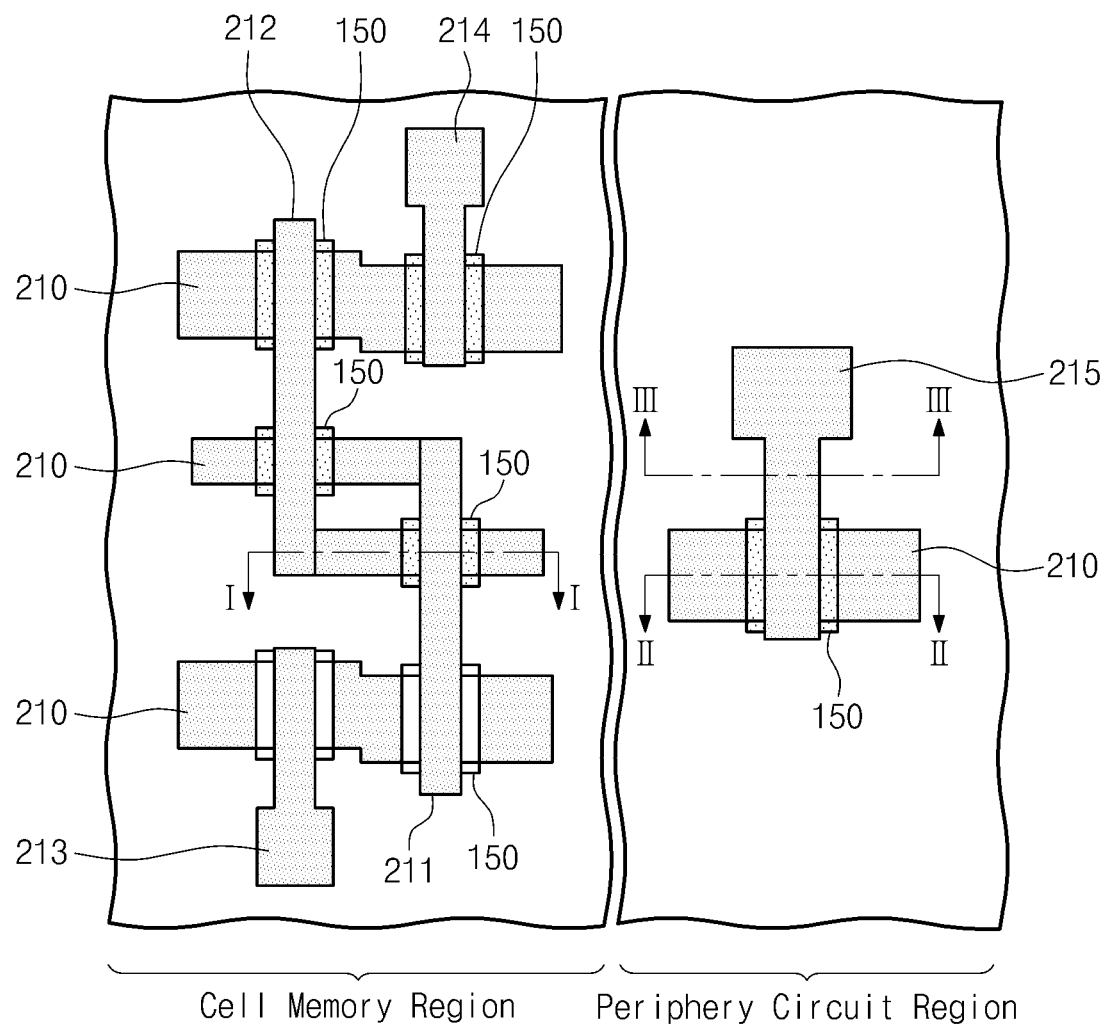
Figure 8B:
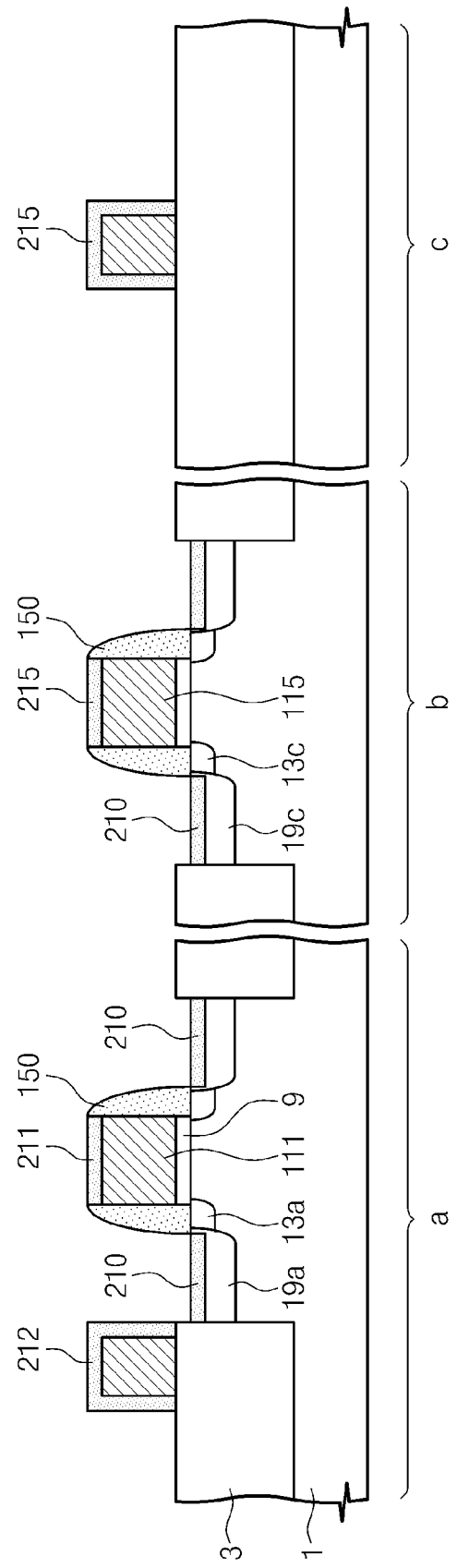

Referring to FIGS. 8A and 8B, a metal layer is stacked on the entire surface of the structure and subjected to heat treatment to form the silicide layers 210 to 215. In this way, the gate silicide layers 211 to 215 are formed on sidewalls and upper surfaces of the gate patterns 111 to 115 on the exposed device isolation layer 3 which are not covered with the sidewall spacer pattern 150, respectively. The active silicide layer 210 is formed on the semiconductor substrate 1 of the active patterns 5. The metal layer is formed of titanium, cobalt, nickel, or platinum. The silicide layers 210 to 215 are formed, for example, of titanium, cobalt, nickel, or platinum silicide. Unsilicided metal layer is removed. Referring to the sectional view of a region "a" of FIG. 8B, the active silicide layer 210 is formed so as to come in contact with the sidewall of the device isolation layer 3 adjacent to the second cell gate pattern 112.

When the capping layer pattern is formed on upper surfaces of the gate patterns 111 to 115, a process of removing the capping layer pattern may additionally be provided before a salicide process of forming the silicide layers 210 to 215.

Subsequently, referring again to FIGS. 1A and 1B, an interlayer insulating layer 23 is formed on the entire surface of the structure. The contact plugs 250 to 252 are formed by penetrating the interlayer insulating layer 23 to be in contact with the active silicide layer 210 or the gate silicide layers 211 to 215. In order to form the contact plugs 250 to 252, when contact holes (not illustrated) for exposing the silicide layers 210 to 215 are formed by patterning the interlayer insulating layer 23, the silicide layers 210 to 215 serve as an etch stop layer. Accordingly, the surface of the semiconductor substrate 1 may be less damaged.

Figure 9A:
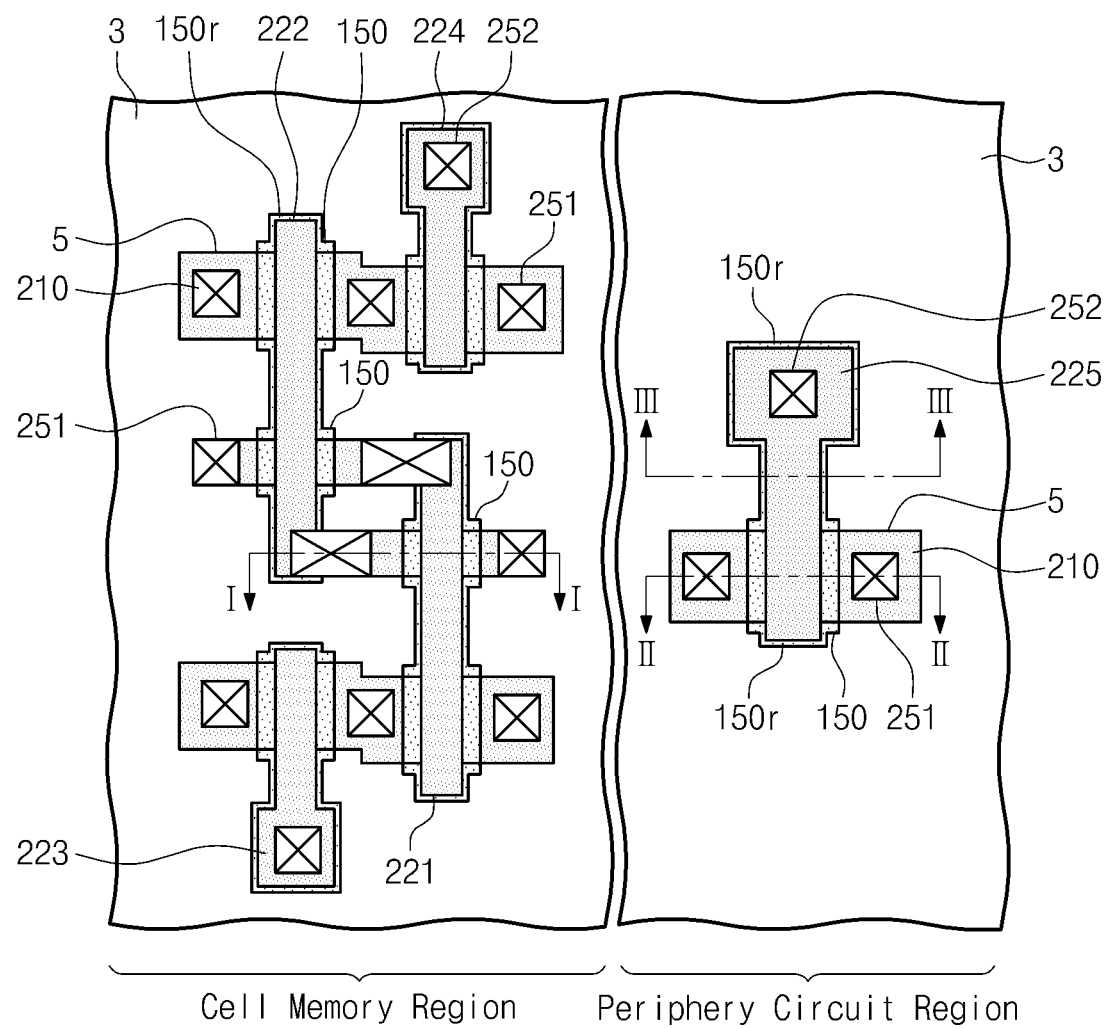
FIG. 9A is a plan view illustrating a semiconductor device according to another embodiment of the inventive concept.
Figure 9B:
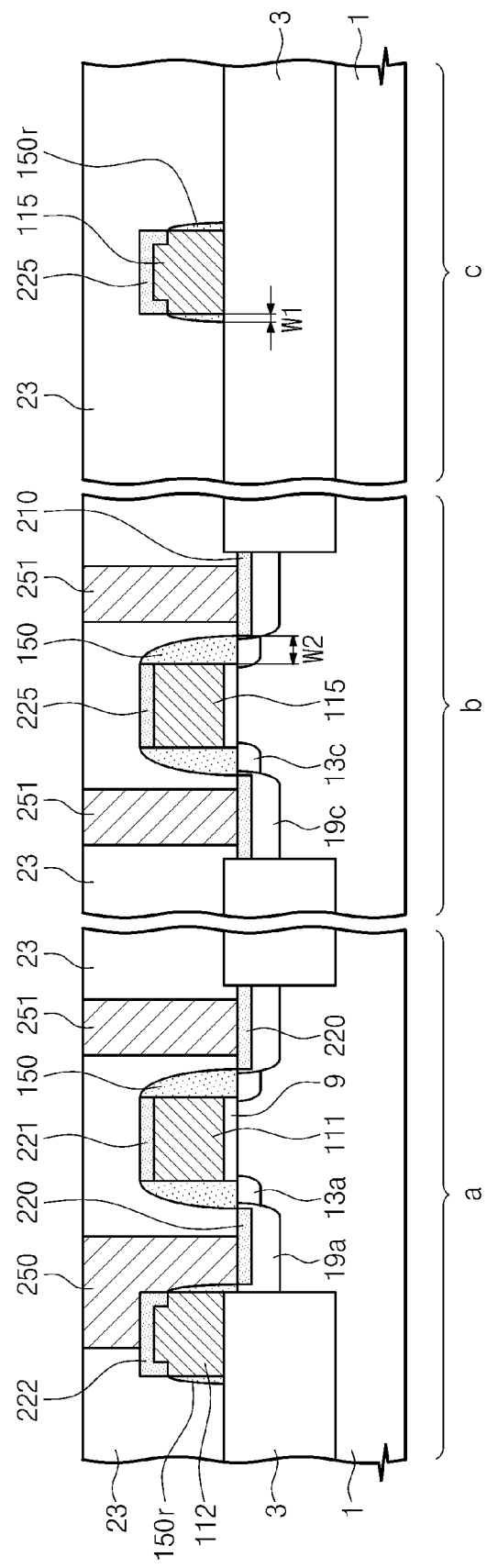
FIG. 9B is a sectional view taken along the lines I-I, II-II, and III-III of FIG. 9A.
Figure 9C:
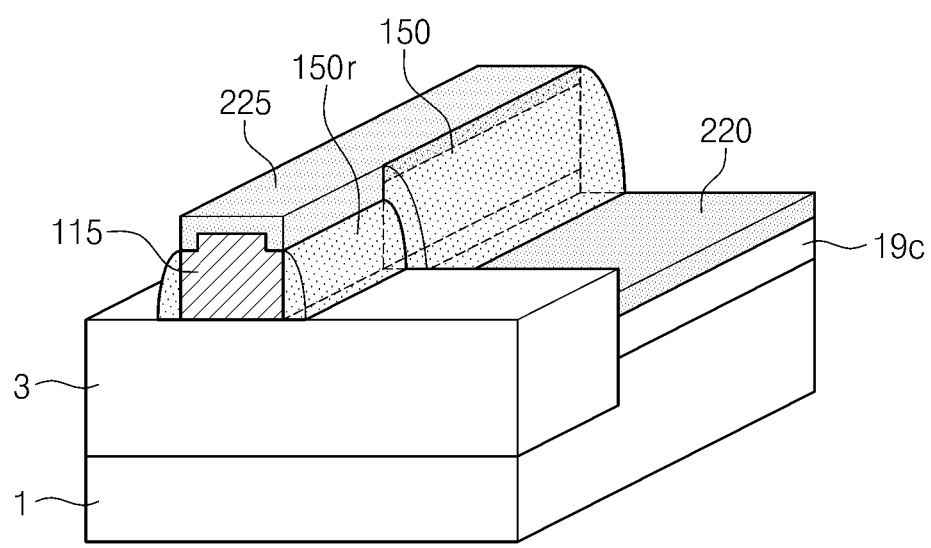
FIG. 9C is a perspective view illustrating a part of a transistor in a periphery circuit region illustrated in FIG. 9A.

According to a modified exemplary embodiment of the inventive concept, in FIGS. 9A and 9B, remaining sidewall spacers 150r may be formed by not removing entirely the exposed sidewall spacers 15 using the mask 17 in the process of removing the exposed sidewall spacers 15. FIGS. 9A, 9B, and 9C illustrate the semiconductor device including such remaining spacers 150r, respectively. FIG. 9A is a plan view illustrating the semiconductor device according to another embodiment of the inventive concept. FIG. 9B is a sectional view taken along the lines I-I, II-II, and III-III of FIG. 9A. FIG. 9C is a perspective view illustrating a part of the transistor in the periphery circuit region illustrated in FIG. 9A.

Referring to the semiconductor device of FIGS. 9A, 9B, and 9C, the remaining sidewall spacers 150r remain in the sidewalls of the gate patterns 111 to 115 on the device isolation layer 3. It is desirable that the width W1 of the remaining sidewall spacer 150r be smaller than half of the width W2 of the sidewall spacer pattern 150. The remaining sidewall spacers 150r are formed so as to expose a part (that is, upper portion) of the gate patterns 111 to 115 on the device isolation layer 3. Then, in a subsequent salicide process, gate silicide layers 221 to 225 are formed in a part and the upper surface of the both sides of the gate patterns 111 to 115 exposed to the device isolation layer 3, and active silicide layers 220 are formed in the active regions 5. The active silicide layer 220 located between the first cell gate pattern 111 and the second cell gate pattern 112 may come in contact with the device isolation layer 3 by the remaining sidewall spacer 150r covering a part of the sidewalls of the second cell gate pattern 112 on the device isolation layer 3. The other configuration and the manufacturing process are the same as the above-described configuration and process.

The full CMOS type SDAM has been described as an example of the cell memory according to the embodiment of the inventive concept. However, it should be apparent to those skilled in the art that the configuration of the inventive concept is applicable to a variety of semiconductor devices such as other DRAMs and NAND or NOR flash memories.

Applicable Example

Figure 10:
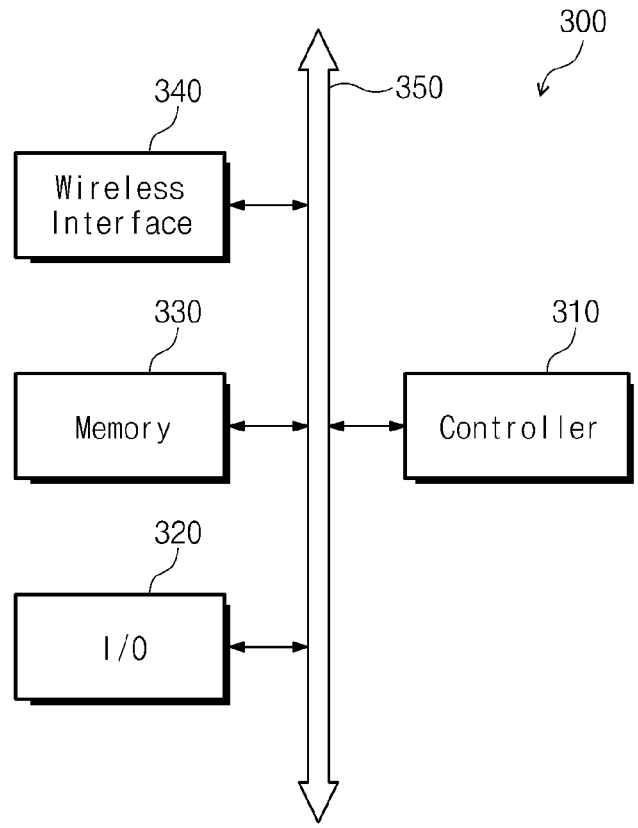
FIG. 10 is a block diagram schematically illustrating an electronic device including the semiconductor memory device according to the embodiment of the inventive concept.
Figure 11:
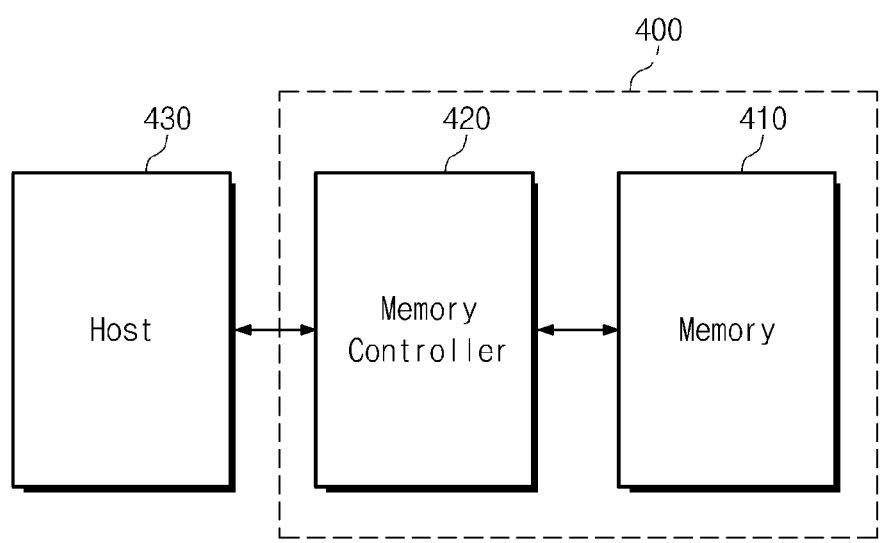
FIG. 11 is a block diagram illustrating a memory system including the semiconductor memory device according to the embodiment of the inventive concept.

FIG. 10 is a block diagram schematically illustrating an electronic device including the semiconductor memory device according to an embodiment of the inventive concept. FIG. 11 is a block diagram illustrating a memory system including the semiconductor memory device according to an embodiment of the inventive concept.

Referring to FIG. 10, an electronic device 300 including the semiconductor memory device according to an embodiment of the inventive concept will be described. The electronic device 300 may be used in wireless communication apparatuses such as a PDA, a laptop computer, a portable computer, a web tablet, a wireless telephone, a cellular phone, and a digital music player, or all elements capable of transmitting and/or receiving information in a wireless environment.

The electronic device 300 includes a controller 310, an input/output device 320 such as a keypad, a keyboard, or a display, a memory 330, and a wireless interface 340 which are connected to each other through a bus 350. The controller 310 may include one or more microprocessors, digital signal processors, or microcontrollers or include an equivalent thereof. The memory 330 may be used to store commands executed by the controller 310, for example. Moreover, the memory 330 may be used to store data of a user. The memory 330 includes the semiconductor memory device according to embodiments of the inventive concept.

The electronic device 300 may use the wireless interface 340 in order to transmit data to a wireless communication network carrying out communication by use of RF signals or to receive data from a network. For example, the wireless interface 340 may include an antenna or a wireless transceiver.

The electronic device 300 according to the embodiments of the inventive concept may be used in communication interface protocols of a third generation communication system such as CDMA, GSM, NADC, E-TDMA, WCDAM, and CDMA2000.

Referring to FIG. 11, a memory system including the semiconductor memory device according to an embodiment of the inventive concept will be described.

A memory system 400 includes a memory 410 storing mass data and a memory controller 420. The memory controller 420 controls the memory 410 to read or write stored data from or to the memory 410 in response to a request for reading/writing the data from a host 430. The memory controller 420 may create an address mapping table used to map addresses supplied from the host 430 (a mobile device or a computer system) to physical addresses of the memory 410. The memory 410 may include the semiconductor memory device according to the embodiment of the inventive concept.

In the semiconductor device according to one embodiment of the inventive concept, the silicide layer is formed on at least a part of both sidewalls of a gate pattern on a device isolation layer, thereby reducing resistance of the gate pattern. This makes an operation speed of the device rapid.

In the semiconductor device according to another embodiment of the inventive concept, since the active silicide layer formed on the active region comes in contact with the sidewall of the device isolation layer, the shared contact does not come in contact with the semiconductor substrate, thereby preventing current from leaking to the semiconductor substrate.

In the semiconductor device according to another embodiment of the inventive concept, since the sidewall spacer is not provided on the sidewall of the conduct line located on the device isolation layer and coming in contact with the shared contact, the area of the shared contact is larger, thereby reducing the contact resistance.

In the semiconductor device according to another embodiment of the inventive concept, the sidewall spacer pattern is formed on at least a part of both sidewalls of the gate pattern in a subsequent salicide process by entirely or partially removing remaining portions of the sidewall spacer except for portions which are used as an ion implantation mask to form source/drain regions. This can reduce resistance of the gate pattern, thereby fabricating a semiconductor device with a rapid operation speed.

The above-described subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:
1. A semiconductor device comprising:
a device isolation layer on a semiconductor substrate to define an active region;
a first gate pattern on the active region, the first gate pattern having a first gate silicide layer;

a second gate pattern on the device isolation layer, the second gate pattern having a second gate silicide layer;

a pair of first sidewall spacer patterns covering both sidewalls of the first gate pattern and both sidewalls of the first gate silicide layer, the pair of first sidewall spacer patterns having the same width; and a pair of second sidewall spacer patterns covering both sidewalls of the second gate pattern without contacting with the second gate silicide layer, the pair of second sidewall spacer patterns having the same width, wherein a width of one of the first sidewall spacer patterns is larger than a width of one of the second sidewall spacer patterns.

2. The semiconductor device of claim 1, wherein a length of the one of the pair of the first sidewall spacer patterns in a longitudinal direction of the first gate pattern is different from a length of the one of the pair of the second sidewall spacer patterns in a longitudinal direction of the second gate pattern.

3. The semiconductor device of claim 1, wherein the first gate silicide layer is disposed on a top of the first gate pattern, and the second gate silicide layer is disposed on a top of the second gate pattern and an upper sidewall of the second gate pattern.

4. A semiconductor device, comprising:

a device isolation layer on a semiconductor substrate to define an active region;

a first gate pattern on the active region, the first gate pattern having a first gate silicide layer;

a first impurity region on the active region adjacent a first side of the first gate pattern;

a second gate pattern on the device isolation layer, the second gate pattern having a second gate silicide layer;

a second impurity region on the active region adjacent a second side of the first gate pattern;

a shared contact electrically connected to the second gate pattern and the first impurity region;

a pair of first sidewall spacer patterns covering both sidewalls of the first gate pattern, the pair of first sidewall spacer patterns having the same width; and a pair of second sidewall spacer patterns covering both sidewalls of the second gate pattern, the pair of second sidewall spacer patterns having the same width, wherein a width of one of the first sidewall spacer patterns is larger than a width of one of the second sidewall spacer patterns.

5. The semiconductor device of claim 4, wherein the first impurity region includes a first high-concentration impurity implantation region between the one of the pair of the first sidewall spacer patterns on the first side of the first gate pattern and the device isolation layer, and a first low-concentration impurity implantation region below the one of the pair of the first sidewall spacer pattern.

6. The semiconductor device of claim 5, further comprising:

an active silicide layer on the first high-concentration impurity implantation region, wherein the shared contact is electrically connected to the second gate silicide layer and the active silicide layer.

7. The semiconductor device of claim 5, wherein the second impurity region includes a second high-concentration impurity implantation region between the other of the pair of the first sidewall spacer patterns on the second side of the first gate pattern and the device isolation layer, and a second low-concentration impurity implantation region below the other of the pair of the first sidewall spacer patterns.

8. The semiconductor device of claim 7, further comprising:

an active silicide layer on the second high-concentration impurity implantation region; and a contact plug electrically connected to the active silicide layer.

9. A semiconductor device, comprising:

a device isolation layer on a semiconductor substrate to define an active region;

a first gate pattern on the active region, the first gate pattern having a first gate silicide layer;

a second gate pattern on the device isolation layer, the second gate pattern having a second gate silicide layer;

a pair of first sidewall spacer patterns covering both sidewalls of the first gate pattern, the pair of first sidewall spacer patterns having the same width; and a pair of second sidewall spacer patterns covering both sidewalls of the second gate pattern, the pair of second sidewall spacer patterns having the same width, wherein a width of one of the first sidewall spacer patterns is larger than a width of one of the second sidewall spacer patterns, and wherein one of the pair of second sidewall spacer patterns overlaps a portion of the active region.

10. The semiconductor device of claim 1, wherein the second gate pattern includes a first portion having a first width and a second portion having a second width on the first portion, and wherein the first width is larger than the second width.

11. The semiconductor device of claim 10, wherein the second gate silicide layer covers the second portion of the second gate pattern.

* * * * *